US006818965B2

(12) United States Patent
Juang et al.

(10) Patent No.: US 6,818,965 B2
(45) Date of Patent: Nov. 16, 2004

(54) PROCESS AND CONFIGURATION FOR MANUFACTURING RESISTORS WITH PRECISELY CONTROLLED LOW RESISTANCE

(75) Inventors: Horng-Yih Juang, Hsinchu (TW); Ying-Chang Wu, Hsinchu (TW); Yi-Min Huang, Hsinchu (TW); Cheng-Er Fan, Hsinchu (TW)

(73) Assignee: Cyntec Company, Hsinchu (TW)

( * ) Notice: Subject to any disclaimer, the term of this patent is extended or adjusted under 35 U.S.C. 154(b) by 0 days.

(21) Appl. No.: 09/867,644

(22) Filed: May 29, 2001

(65) Prior Publication Data

US 2002/0180000 A1 Dec. 5, 2002

(51) Int. Cl.[7] .............................................. H01C 27/02
(52) U.S. Cl. ...................... 257/536; 257/363; 257/516; 257/528; 257/720
(58) Field of Search ................................ 257/536, 363, 257/516, 528, 720, 358, 167, 249, 762

(56) References Cited

U.S. PATENT DOCUMENTS

| | | | | |
|---|---|---|---|---|
| 3,680,028 A | * | 7/1972 | Black et al. ................. | 338/308 |
| 3,916,071 A | * | 10/1975 | Kinnebrew et al. ......... | 428/376 |
| 3,996,551 A | * | 12/1976 | Croson ........................ | 338/309 |
| 4,019,168 A | * | 4/1977 | Collins ........................ | 338/309 |
| 4,164,607 A | * | 8/1979 | Thiel et al. .................. | 428/621 |
| 4,418,474 A | * | 12/1983 | Barnett ......................... | 29/612 |
| 4,677,413 A | * | 6/1987 | Zandman et al. ............. | 338/7 |
| 4,780,702 A | * | 10/1988 | Snel et al. ................... | 338/308 |
| 4,788,523 A | * | 11/1988 | Robbins ...................... | 338/309 |
| 5,039,976 A | * | 8/1991 | Drabkin ....................... | 338/314 |
| 5,850,171 A | * | 12/1998 | Lin et al. .................... | 338/320 |
| 6,322,711 B1 | * | 11/2001 | Chen ........................... | 216/16 |
| 6,489,881 B1 | * | 12/2002 | Aleksandravicius et al. ..... | 338/ 307 |
| 6,529,115 B2 | * | 3/2003 | Szwarc et al. ............... | 338/309 |
| 2002/0075131 A1 | * | 6/2002 | Coates et al. ............... | 338/308 |

FOREIGN PATENT DOCUMENTS

| JP | 8-22903 | * | 1/1996 |
|---|---|---|---|
| JP | 8-22903 | * | 8/1996 |
| JP | 2000-173801 | * | 6/2000 |

OTHER PUBLICATIONS

Thomas et al. "Ti–Cu–Ni–Au (TCNA) compatibilty with resistor and bilevel crossover circuit processing" (J. Vac. Sci. Technol., vol. 13, No. 1, Jan./Feb. 1976).*
Dhere et al. "Low TCR Kanthal Resistive Films for Hybrid IC's" (J. Vac. Sci. Technol., vol. 7, No. 6.*
Brueckner et al. "Electrical resistance and mechanical stress in NiCr/Cu/NiCr thin films" J appl. phys., vol. 85, No. 2.*

* cited by examiner

*Primary Examiner*—Nathan J. Flynn
*Assistant Examiner*—Ahmed N. Sefer
(74) *Attorney, Agent, or Firm*—Bo-In Lin

(57) ABSTRACT

The present invention discloses a resistor supported on a metal plate composed of a low temperature coefficient of resistance (TCR) metallic material. The resistor includes at least two electrode columns composed of the low TCR metallic material disposed on the metal plate. The resistor further includes at least an electrode layer disposed on each of the electrode columns to form an electrode for each of the electrode columns. In a preferred embodiment, the low TCR metallic material composed of the metal plate further comprises a nickel-copper alloy. In another preferred embodiment, the electrode layer disposed on each of the electrode columns further comprises a copper layer and a tin-lead alloy layer on each of the electrode columns. In another preferred embodiment, the electrode columns disposed on the metal plate having a precisely defined position for providing precisely defined resistance for the resistor ranging between one milli-ohm to one ohm.

28 Claims, 4 Drawing Sheets

PROCESS AND CONFIGURATION FOR MANUFACTURING RESISTORS WITH PRECISELY CONTROLLED LOW RESISTANCE

BACKGROUND OF THE INVENTION

1. Field of the Invention

This invention relates generally to the device structure and processes for manufacturing resistors. More particularly, this invention relates to an improved configuration and process for manufacturing resistors with precisely controlled low resistance.

2. Description of the Prior Art

For those of ordinary skill in the art, the process of manufacturing a resistor with precisely controlled low resistance becomes a challenge for several reasons. As that shown in FIG. 1, a conventional resistor 100 is supported on a ceramic substrate 102 that includes a input electrode 104 and an output electrode 106 formed on two opposite ends on the ceramic substrate 102. A layer of thin resistive film 108 is formed on the top surface 112 of the ceramic substrate 102 between two electrodes 104 and 106 and a preservation protective layer 110 is formed on top of the resistive film 108. The resistor 100 with such a configuration can be mounted onto a printed circuit board with a surface mount technology (SMT) for establishing connection through the electrodes to the external circuits. Alternatively, the top surface 114 of the input electrode 104 and the top surface 116 of the output electrode 106 can be soldered to circuits on to printed circuit board by applying a reflow process.

The resistor 100 is manufactured by a conventional process of first attaching the resistive film 108 and the input and output electrodes 104 and 106 on the top surface 112 of the ceramic substrate 102 with the resistive film 108 connected between the input and output electrodes. The protective layer 110 is then formed to cover the resistor 100. The processes of forming the layers and the electrodes are however time consuming. Furthermore, for the purpose of making resistors of low resistance with precisely controlled resistance variation to satisfy a tight tolerance requirement, the process often encounters a difficulty of low production yield due to the difficulties of precisely controlling the resistance variations within a narrow range. Small variations in film formation during the manufacturing processes often generate large and uncontrollable resistance variations. It is often required to apply trimming process either by laser or mechanical method by changing the thickness of the resistive film 108 to satisfy the resistance requirement. The resistance trimming and adjusting processes further adds to the complexity of the manufacturing processes that leads to additional production costs and low product yields. Such difficulties are particularly pronounced for resistors produced to satisfy low resistance and very tight tolerance requirements of resistance variation.

In addition to the difficulties of complexities in manufacturing processes and low production yields, a conventional resistor as shown also has a disadvantage that the resistor has a poor performance in heat dissipation. The resistor 100 as shown is provided to dissipate heat from two electrodes 104 and 106 because the ceramic substrate 102 is a poor heat conductor. However, the heat dissipation efficiency is very low due to the relative small contact areas between the electrodes to the circuits formed on a printed circuit board. For modern electronic device application, due to the requirement to place large amount of electronic circuits in very small volume, the low heat dissipation often become a design bottleneck and hindering the progress of increasing the packing density to further minimize the electronic apparatuses. In addition to the difficulties of low heat dissipation rate, there is an associated design concern related to the temperature coefficient of resistance (TCR). As the temperature fluctuates caused partially by poor heat dissipation, the resistance changes due to the changes of temperature. System performance and functions carried out by circuits connected with the resistors that has indefinite and uncontrollable variations of resistance may be adversely affected due to these uncertain resistance variations.

Therefore, a need still exists in the art of design and manufacture of resistance of precisely controlled ultra-low resistance to provide a novel and improved structure and manufacture processes to resolve the difficulties. It is desirable that the improved resistor configuration and manufacturing method can be simplified to achieve lower production costs, high production yield while capable of providing resistors with low resistance with tightly controllable range of resistance variations. It is further desirable the new and improved resistor and manufacture method can improve the performance of heat dissipation such that the concerns of temperature elevation during operations can be circumvented.

SUMMARY OF THE PRESENT INVENTION

It is therefore an object of the present invention to provide a new structural configuration and manufacture method for manufacturing a resistor of low resistance and precisely controllable range of resistance variations. The new configuration and method of manufacturing thus enable those of ordinary skill in the art to overcome the aforementioned difficulties and limitations encountered in the prior art.

Specifically, it is an object of the present invention to provide a new method for manufacturing a resistor directly on low TCR metallic materials such as a nickel-copper alloy by precisely etching and defining electrode columns to obtain precisely controlled value of a low resistance. The manufacturing processes are simplified without requiring further trimming for resistance adjustments. The difficulties of poor heat dissipation and TCR resistance variations are also resolved.

Briefly, in a preferred embodiment, the present invention includes a resistor supported on a metal plate composed of a low temperature coefficient of resistance (TCR) metallic material. The resistor includes at least two electrode columns composed of the low TCR metallic material disposed on the metal plate. The resistor further includes at least an electrode layer disposed on each of the electrode columns to form an electrode for each of the electrode columns. In a preferred embodiment, the low TCR metallic material composed of the metal plate further comprises a nickel-copper alloy. In another preferred embodiment, the electrode layer disposed on each of the electrode columns further comprises a copper layer and a tin-lead alloy layer on each of the electrode columns. In another preferred embodiment, the electrode columns disposed on the metal plate having a precisely defined position for providing precisely defined resistance for the resistor ranging between one milli-ohm to one ohm. In another preferred embodiment, the resistor having a thickness ranging between 0.05 to 0.5 millimeters and a length ranging between 1.0 to 7.0 millimeters. In another preferred embodiment, each of the electrode columns on the metal plate having a width and length ranging between 0.1 to 3.2 millimeter, a height ranging between 0.05 to 0.5 millimeters and distance ranging between 0.4 to 6.2 millimeters between every two electrode columns.

In a different embodiment, the invention further includes a resistor supported on a metal plate composed of a low temperature coefficient of resistance (TCR) metallic material. The resistor includes at least two column-shaped electroplated electrodes disposed on the metal plate composed of the low TCR metallic material.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
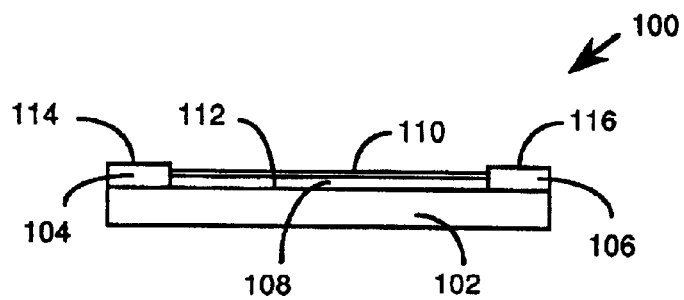
FIG. 1 is a cross sectional view showing the structure of a conventional resistor supported on a ceramic substrate.
Figure 2A:
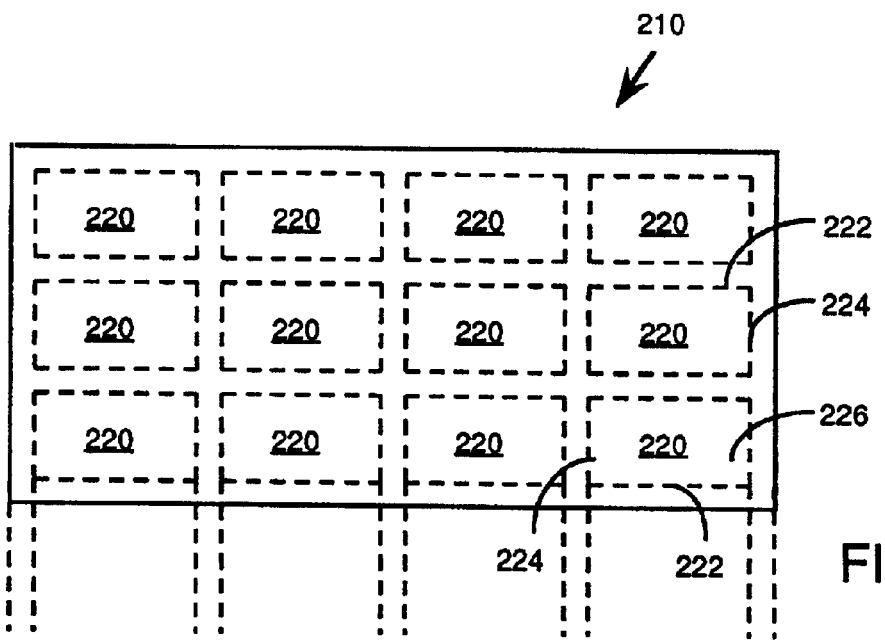
FIGS. 2A and 2B are a top view and a side cross sectional view of a low resistor array formed on a nickel-copper metal plate of this invention.
Figure 2B:
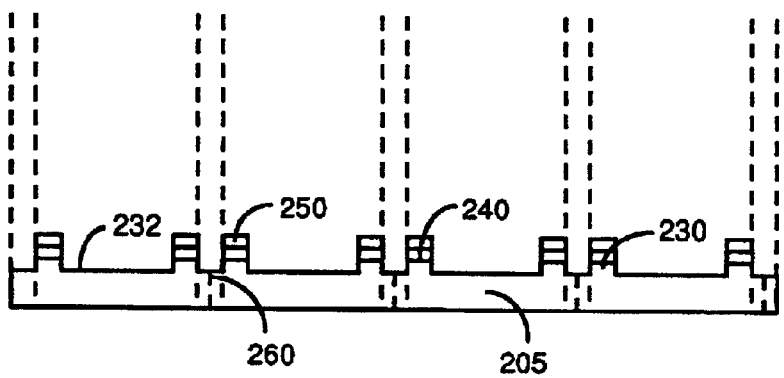
Figure 3:
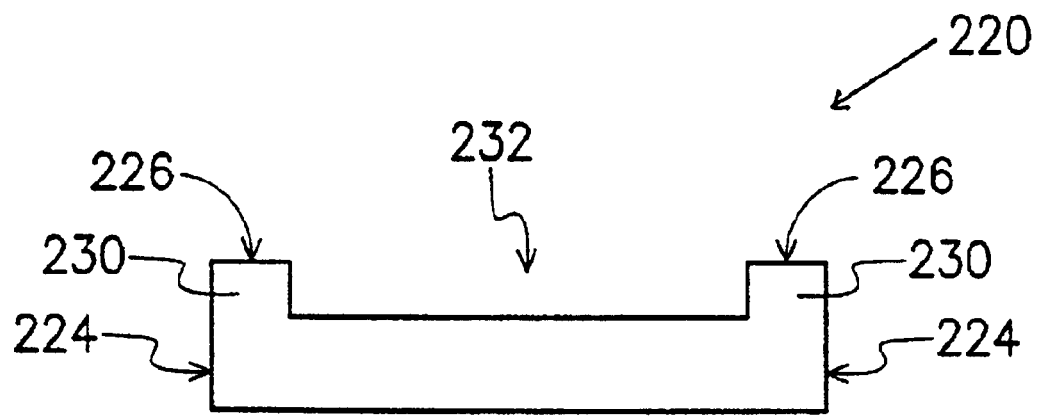
FIGS. 3 and 4 are cross sectional views of a resistor formed on a metal plate with specially etched electrodes of this invention.
Figure 4:
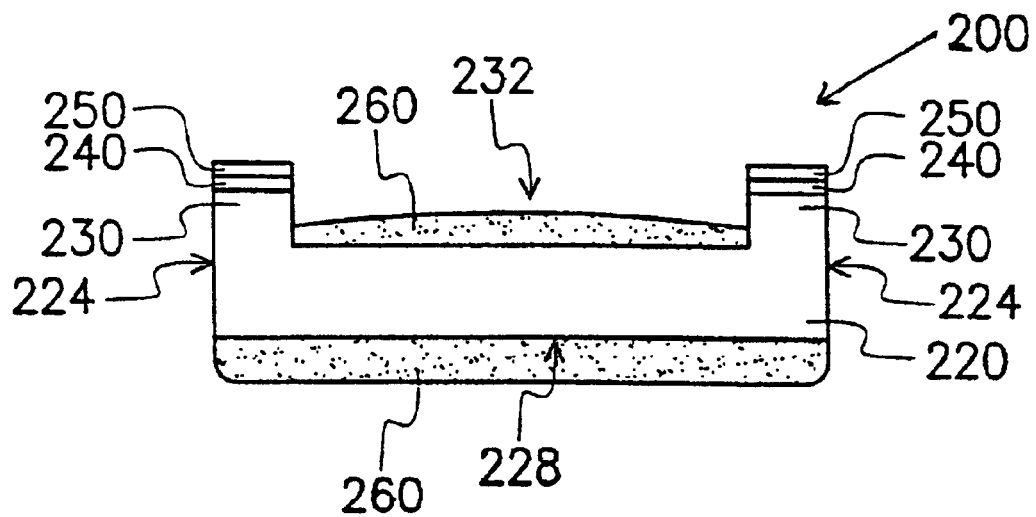

FIG. 2A is a top view and FIG. 2B is a cross sectional view of an array of resistors 220 formed according to the manufacturing processes as described below for FIGS. 3 and 4 of this invention. As shown in FIG. 2A, the each resistor 220 includes two electrodes 230 covered with a first and second electroplated layers 240 and 250. The electrodes 230 are formed by etching a central portion 232 from the top of a metal plate 205 composed of low-resistance metals such as a nickel-copper alloy plate. The manufacturing process of the resistor 220 begins with a metal plate, preferably a metal plate formed composed of a nickel-copper alloy that has a very low resistance. The metal plate is etched by applying a lithographic method with precisely controlled distance between two electrodes 230. Referring to FIG. 4 for the processes to electroplate a first electrode layer 240 composed of copper and a second electrode layer 250 composed of a tin-lead alloy. The resistor 200 is then covered at the top and bottom surfaces with a protective layer 260. These processes are carried out on a metal plate to form an array of resistor 220 as that shown in FIG. 2. A scribing process is then applied to separate each of these resistors into individual resistor chips along the scribe lines 260 as shown in FIG. 2B.

Figure 5:
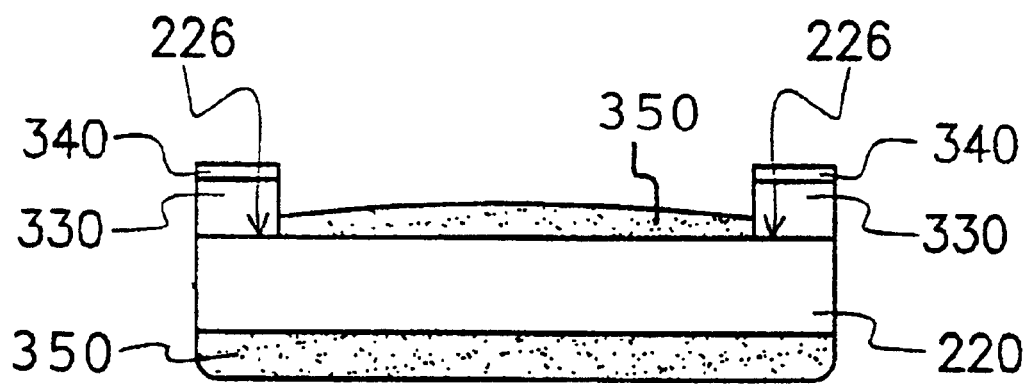
FIG. 5 is a cross sectional view of a resistor formed on a metal plate with specially electroplated-electrodes of this invention.
Figure 6:
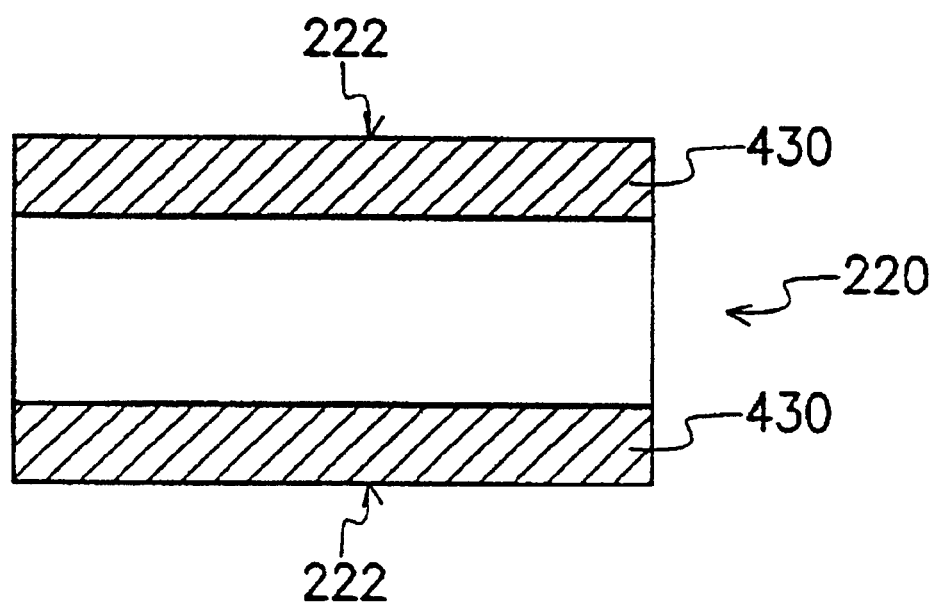
FIG. 6 is a top view of a resistor formed on a metal plate with specially configured electrodes formed on two elongated sides of the metal plates.
Figure 7:
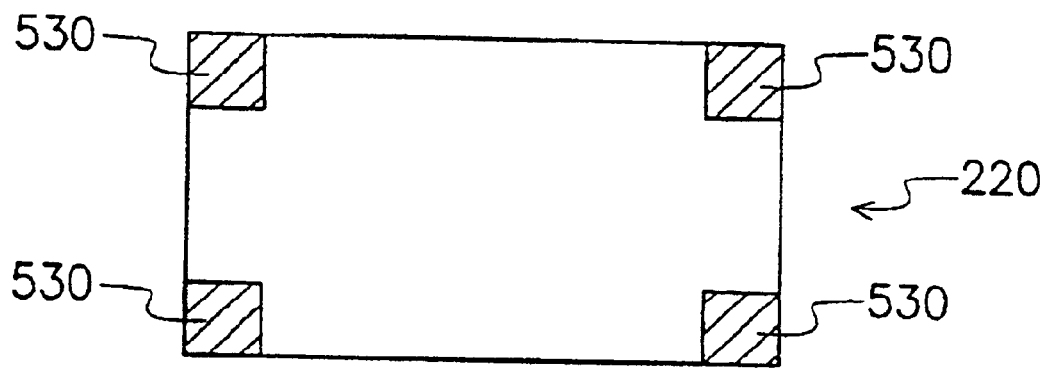
FIGS. 7 and 8 are top views of two preferred embodiment of this invention with specially configured electrodes formed on metal plate constituting a resistor of low resistance of this invention.
Figure 8:
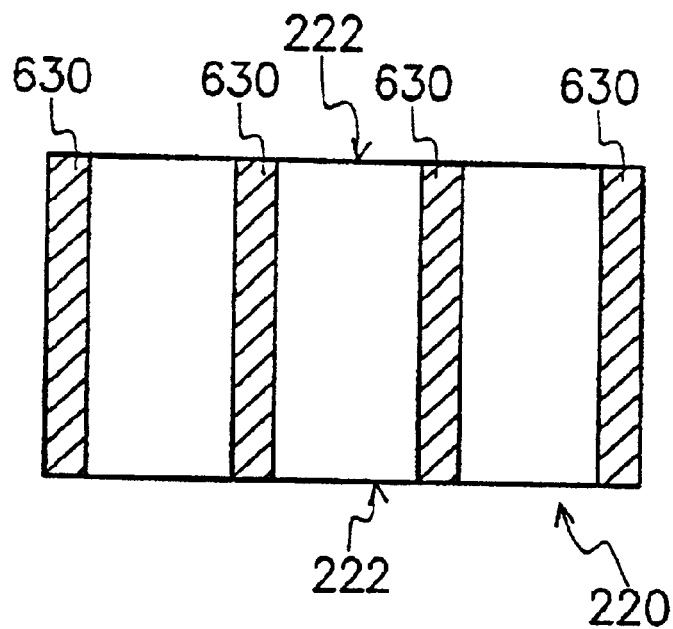

FIG. 5 is a cross sectional view of another embodiment of a resistor of this invention. Again, the resistor is formed on a metal plate 220 composed of a low-resistance metal or metallic alloys such as a nickel-copper alloy. Instead of etching a central portion for defining the electrode, the electrodes 330 and 340 are formed by directly electroplating a copper block 330 and a tin-lead alloy block 340 on the top surface of the metal plate 220. The resistor is then covered with protective layer 350. FIG. 6 shows an alternate embodiment, where the electrodes 430 are formed on two longer edges opposite each other. FIGS. 7 and 8 are alternate embodiments where the electrodes 530 and 630 are formed at different parts on the top surface of the metal plate by applying either a wet etching process or electroplating process.

According to above descriptions, a method for manufacturing a plurality of resistors is disclosed in this invention, the method includes steps of: A) applying a lithographic process for etching a top portion of a metal plate for precisely defining a plurality of electrode columns on the metal plate. B) electroplating at least an electrode layer on each of the electrode columns to form an electrode for each of the electrode column. And, c) scribing the metal plate into a plurality of resistors each comprising at least two electrodes formed in step b). In a preferred embodiment, the step a) of applying a lithographic process for etching a top portion of a metal plate is a step of etching a top portion of a metal plate comprising nickel-copper alloy. In another preferred embodiment, the step b) of electroplating at least an electrode layer on each of the electrode columns is a step of electroplating a copper layer and a tin-lead alloy layer on each of the electrode columns. In another preferred embodiment, the step a) of applying a lithographic process for etching a top portion of a metal plate for precisely defining a plurality of electrode columns on the metal plate is a step of forming a plurality of resistors each having a precisely defined resistance ranging between one milli-ohm to one ohm. In another preferred embodiment, the step a) of applying a lithographic process for etching a top portion of a metal plate for precisely defining a plurality of electrode columns on the metal plate is a step of forming a plurality of resistors each having a thickness ranging between 0.05 to 0.5 millimeters and a length ranging between 1.0 to 7.0 millimeters. In another preferred embodiment, the step a) of applying a lithographic process for etching a top portion of a metal plate for precisely defining a plurality of electrode columns on the metal plate is a step of forming the electrode columns each having a width and length ranging between 0.1 to 3.2 millimeter, a height ranging between 0.05 to 0.5 millimeters and distance ranging between 0.4 to 6.2 millimeters between every two electrode columns.

In an alternate preferred embodiment, this invention also discloses a method for manufacturing a plurality of resistors. The method includes steps of: A) applying an electroplating process for precisely forming a plurality of column-shaped electrodes on a metal plate. And b) scribing the metal plate into a plurality of resistors each comprising at least two electrodes formed in step a). In another preferred embodiment, the step a) of applying an electroplating process for precisely forming a plurality of column-shaped electrodes on a metal plate is a step of electroplating the electrodes on a metal plate comprising nickel-copper alloy. In another preferred embodiment, the step a) of applying an electroplating process for precisely forming a plurality of column-shaped electrodes is a step of electroplating a copper layer and a tin-lead alloy layer to form each of the electrodes. In another preferred embodiment, the step a) of applying an electroplating process for precisely forming a plurality of column-shaped electrodes is a step of forming a plurality of resistors each having a precisely defined resistance ranging between one milli-ohm to one ohm.

This invention further discloses a resistor array supported on a metal plate composed of a low temperature coefficient of resistance (TCR) metallic material. The resistor array includes a plurality of electrode columns composed of the low TCR metallic material disposed on the metal plate. The resistor array further includes at least an electrode layer disposed on each of the electrode columns to form an electrode for each of the electrode columns. In a preferred embodiment, the resistor array further includes a plurality of scribing lines for scribing the metal plate into a plurality of resistors each comprising at least two electrodes. In another preferred embodiment, the low TCR metallic material composed of the metal plate further comprises a nickel-copper alloy. In a preferred embodiment, the electrode layer disposed on each of the electrode columns further comprises a copper layer and a tin-lead alloy layer on each of the electrode columns. In a preferred embodiment, the plurality of electrode columns disposed on the metal plate having a precisely defined position for providing precisely defined resistance for each of the resistors ranging between one milli-ohm to one ohm. In a preferred embodiment, each of the plurality of resistors having a thickness ranging between 0.05 to 0.5 millimeters and a length ranging between 1.0 to 7.0 millimeters. In a preferred embodiment, each of the plurality of electrode columns on the metal plate having a width and length ranging between 0.1 to 3.2 millimeter, a height ranging between 0.05 to 0.5 millimeters and distance ranging between 0.4 to 6.2 millimeters between every two electrode columns.

In a different preferred embodiment, this invention further discloses a resistor array supported on a metal plate composed of a low temperature coefficient of resistance (TCR) metallic material. The resistor array includes a plurality of column-shaped electroplated electrodes disposed on the metal plate composed of the low TCR metallic material. The resistor array further includes a plurality of scribing lines for scribing the metal plate into a plurality of resistors each comprising at least two electrodes.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A resistor array comprising:

a plurality of resistors each comprising a metallic bulk base;

a plurality of electrodes composed of conductive material disposed directly on said metallic bulk base for connecting each of said resistors to external circuits wherein said metallic bulk base constituting a single layer electrically conductive medium between every two of said electrodes having a lithographically-defined precisely controlled distance for providing a precisely defined resistance for each of said resistors.

2. The resistor array of claim 1 further comprising:

a plurality of scribing lines disposed between said resistors for scribing said resistor array into a plurality of resistors each comprising at least two electrodes for connecting each of said resistors to external circuits.

3. The resistor array of claim 1 wherein:

said metallic bulk base constituting said single layer electrically conductive medium comprising a nickel-copper alloy.

4. The resistor array of claim 1 wherein:

each of said electrodes further comprises a copper layer and a tin-lead alloy layer.

5. The resistor array of claim 1 wherein:

said precisely defined resistance for each of said resistors ranging approximately from one milli-ohm to one ohm.

6. The resistor array of claim 1 wherein:

said metallic bulk base constituting said single layer electrically conductive medium of each of said plurality of resistors having a thickness ranging approximately from 0.05 to 0.5 millimeters and a length ranging approximately from 1.0 to 7.0 millimeters.

7. The resistor array of claim 1 wherein:

each of said plurality of electrodes disposed directly on said metallic bulk base having a width and length ranging approximately from 0.1 to 3.2 millimeter, a height ranging approximately from 0.05 to 0.5 millimeters and distance ranging approximately from 0.4 to 6.2 millimeters between every two electrode columns.

8. A resistor array comprising:

a plurality of resistors each comprising a metallic bulk base;

a plurality of electrodes composed of conductive material disposed directly on said metallic bulk base for connecting each of said resistors to external circuits wherein said metallic bulk base between every two of said electrodes having a precisely controlled distance for providing a precisely defined resistance for each of said resistors at least an electrode layer of a different conductive material disposed on each of said electrodes.

9. A resistor array comprising:

a plurality of resistors each comprising a metallic bulk base;

a plurality of column-shaped electroplated electrodes disposed directly on said metallic bulk base for connecting each of said resistors to external circuits and wherein said metallic bulk base constituting a single layer electrically conductive medium having a precisely controlled distance between every two of said electrodes for providing a lithographically-defined precisely defined resistance for each of said resistors.

10. The resistor array of claim 9 further comprising:

a plurality of scribing lines disposed between said resistors for scribing said resistor array into a plurality of resistors each comprising at least two electrodes for connecting each of said resistors to external circuits.

11. The resistor array of claim 9 wherein:

said metallic bulk base constituting said single layer electrically conductive medium comprising a nickel-copper alloy.

12. The resistor array of claim 9 wherein:

each of said plurality of column-shaped electroplated electrodes disposed directly on said metallic bulk base further comprises a copper layer and a tin-lead alloy layer.

13. The resistor array of claim 9 wherein:

said precisely defined resistance for each of said resistors ranging approximately from one milli-ohm to one ohm.

14. The resistor array of claim 9 wherein:

said metallic bulk base of each of said plurality of resistors having a thickness ranging approximately from 0.05 to 0.5 millimeters and a length ranging approximately from 1.0 to 7.0 millimeters.

15. The resistor array of claim 9 wherein:

each of said plurality of column-shaped electrodes disposed directly on said metallic bulk base having a width and length ranging approximately from 0.1 to 3.2 millimeter, a height ranging approximately from 0.05 to 0.5 millimeters and distance ranging approximately from 0.4 to 6.2 millimeters between every two electrodes.

16. A resistor comprising:

a metallic bulk base; and at least two electrodes composed of a conductive material disposed directly on said metallic bulk base for connecting said resistor to external circuits wherein said metallic bulk base constituting a single layer electrically conductive medium and having a lithographically-defined precisely controlled distance between said two electrodes for providing a precisely defined resistance for said resistor.

17. The resistor of claim 16 wherein:

said metallic bulk base constituting said single layer electrically conductive medium comprising a nickel-copper alloy.

18. The resistor of claim 16 wherein:

each of said electrodes further comprises a copper layer and a tin-lead alloy layer.

19. The resistor of claim 16 wherein:

said precisely defined resistance for said resistor ranging approximately from one milli-ohm to one ohm.

20. The resistor of claim 16 wherein:

said metallic bulk base of said resistor having a thickness ranging approximately from 0.05 to 0.5 millimeters and a length ranging approximately from 1.0 to 7.0 millimeters.

21. The resistor of claim 16 wherein:

each of said electrodes disposed directly on said metallic bulk base having a width and length ranging approximately from 0.1 to 3.2 millimeter, a height ranging approximately from 0.05 to 0.5 millimeters and distance ranging approximately from 0.4 to 6.2 millimeters between every two electrode columns.

22. A resistor comprising:

a metallic bulk base;

at least two electrodes composed of a conductive material disposed directly on said metallic bulk base for connecting said resistor to external circuits and having a precisely controlled distance between said two electrodes for providing a precisely defined resistance for said resistor; and at least an electrode layer of a different conductive material disposed on each of said electrodes.

23. A resistor comprising:

a metallic bulk base; and a least two column-shaped electroplated electrodes disposed directly on said metallic bulk base for connecting said resistor to external circuits wherein said metallic bulk base constituting a single layer electrically conductive medium and having a lithographically-defined precisely controlled distance between said electrodes for providing a precisely defined resistance for said resistor.

24. The resistor of claim 23 wherein:

said metallic bulk base comprising a nickel-copper alloy.

25. The resistor of claim 23 wherein:

each of said column-shaped electroplated electrodes further comprises a copper layer and a tin-lead alloy layer.

26. The resistor of claim 23 wherein:

said precisely defined resistance for said resistor ranging approximately from one milli-ohm to one ohm.

27. The resistor of claim 23 wherein:

said metallic bulk base of said resistor having a thickness ranging approximately from 0.05 to 0.5 millimeters and a length ranging approximately from 1.0 to 7.0 millimeters.

28. The resistor of claim 23 wherein:

each of said column-shaped electrodes disposed directly on said metallic bulk base having a width and length ranging approximately from 0.1 to 3.2 millimeter, a height ranging approximately from 0.05 to 0.5 millimeters and distance ranging approximately from 0.4 to 6.2 millimeters between every two electrodes.

* * * * *